United States Patent [19]

Kobayashi et al.

[11] Patent Number: 4,596,852

[45] Date of Patent: Jun. 24, 1986

[54] PROCESS FOR PRODUCING A GEL-LIKE COMPOSITION OF A HIGH POLYMER OF ACETYLENE, AND PROCESS FOR MOLDING SAID COMPOSITION

[75] Inventors: Yukio Kobayashi; Hideki Shirakawa, both of Yokohama; Sakuji Ikeda, Tokyo, all of Japan

[73] Assignee: Showa Denko K.K., Tokyo, Japan

[21] Appl. No.: 755,210

[22] Filed: Jul. 12, 1985

Related U.S. Application Data

[60] Continuation of Ser. No. 553,872, Nov. 21, 1983, abandoned, which is a continuation of Ser. No. 301,891, Sep. 11, 1981, abandoned, which is a division of Ser. No. 224,517, Nov. 19, 1980, abandoned.

[30] Foreign Application Priority Data

| Mar. 29, 1979 [JP] | Japan | 54-36283 |
| Mar. 29, 1979 [JP] | Japan | 54-36288 |
| Apr. 25, 1979 [JP] | Japan | 54-50244 |
| May 4, 1979 [JP] | Japan | 54-54017 |
| May 4, 1979 [JP] | Japan | 54-54018 |

[51] Int. Cl.$^4$ .............................................. C08L 49/00
[52] U.S. Cl. .................................................. 524/550
[58] Field of Search ............................................ 524/550

[56] References Cited

U.S. PATENT DOCUMENTS

| 3,119,799 | 1/1964 | Natta et al. | 526/285 |
| 3,256,235 | 6/1966 | Natta et al. | 526/285 |
| 3,933,722 | 1/1976 | Krutchen | 524/550 |
| 4,228,060 | 10/1980 | Pez | 524/108 |
| 4,362,680 | 12/1982 | Kobayashi et al. | 264/104 |

FOREIGN PATENT DOCUMENTS

826674  1/1960  United Kingdom ................ 526/285

OTHER PUBLICATIONS

Synthetic Metals, 1 (1979/80) 175–184.
J. Pol. Sci., Pol. Leters Ed., vol. 17, 779–786 (1979).
J. Pol. Sci., vol. 12, No. 1, pp. 11–20 (1974).
S. L. Hsu et al., J. Chem. Phys. 69 (1), 106–111 (1978).
Abstract of Japanese Patent Publication No. 32581/73.

*Primary Examiner*—Paul R. Michl
*Assistant Examiner*—Alex H. Walker
*Attorney, Agent, or Firm*—Wenderoth, Lind & Ponack

[57] ABSTRACT

Process for molding an acetylene high polymer by press-forming a gel-like composition composed of 5 to 95% by weight of an acetylene high polymer having a fibril structure and 95 to 5% by weight of an organic solvent.

5 Claims, No Drawings

PROCESS FOR PRODUCING A GEL-LIKE COMPOSITION OF A HIGH POLYMER OF ACETYLENE, AND PROCESS FOR MOLDING SAID COMPOSITION

This application is a continuation of Ser. No. 553,872, filed Nov. 21, 1983, now abandoned, which is a continuation of Ser. No. 301,891, filed Sept. 11, 1981, now abandoned, which is a division of Ser. No. 224,517, filed Nov. 19, 1980, now abandoned.

FIELD OF INVENTION

This invention relates to a process for producing a gel-like composition of an acetylene high polymer or a porous acetylene high polymer, and to a process for molding said composition or polymer. Molded articles of an acetylene high polymer obtained from these products are useful as organic semiconductors.

DESCRIPTION OF PRIOR ART

It has already been known that a high polymer of acetylene obtained by polymerizing acetylene using a Ziegler-Natta catalyst composed of a transition metal compound and an organometallic compound is useful as an organic semi-conductor material in electronics or an electrical element. However, since the acetylene high polymer so obtained does not melt even when heated, and readily undergoes oxidative degradation under heat, it cannot be molded by molding methods normally used for thermoplastic resins. Furthermore, no solvent has been found as yet which dissolves the acetylene high polymer. Accordingly, the production of practical molded articles of the acetylene polymer has previously been limited to the following two methods.

(a) A method comprising press-forming a powdery acetylene high polymer.

(b) A method which comprises introducing gaseous acetylene into a catalyst solution prepared by dissolving a catalyst system composed of a transition metal compound and an organometallic compound in an aromatic hydrocarbon such as toluene or an aliphatic hydrocarbon such as hexadecane, and polymerizing the acetylene on an interface between the acetylene gas and the catalyst solution, or polymerizing acetylene on that surface of the wall of a glass vessel which is coated with the catalyst solution, thereby to produce a film-like or fibrous acetylene high polymer (Japanese Patent Publication No. 32581/73). In order to obtain a film-like or fibrous acetylene high polymer by this method, it is essential to use more than 0.1 mole of the transition metal compound per liter of the polymerization solvent.

The method (a) gives only a molded article having low mechanical strength. According to the method (b), the form of the resulting polymer is limited to a film-like or fibrous form, and its thickness is limited. Thus, only a film-like or fibrous molded article having a small thickness can substantially be obtained.

(c) It is also known that polymerization of acetylene in hexane solvent using a special catalyst, $\mu(\eta^1:\eta^5$-cyclopentadienyl)-tris($\eta$-cyclopentadienyl)-dititanium (Ti-Ti) [(C$_5$H$_4$)$_5$(C$_5$H$_5$)$_3$Ti$_2$], gives a gel-like acetylene high polymer [S. L. Hsu et al., J. Chem. Phys., 69 (1), 106–111 (1978)].

However, because the catalyst used in this method is very special, the cost of the catalyst is high. Moreover, a powder or a hard mass forms in addition to the gel-like acetylene high polymer, and press-forming the resulting polymerization product cannot give a uniform molded article of acetylene high polymer having high mechanical strength.

SUMMARY OF THE INVENTION

The present inventors extensively investigated a process for producing an easily moldable acetylene high polymer and a process for processing the acetylene polymer, which are free from the prior art's defect that the method (a) cannot give molded articles having sufficient mechanical strength, the method (b) can give an acetylene high polymer having high mechanical strength, but there can only be obtained a film-like or fibrous molded article having a small thickness, and that in the method (c), the cost of the catalyst becomes high because the catalyst used is special, and since a uniform gel-like product cannot be obtained, molding of the product cannot afford a molded article having sufficiently high mechanical strength. This investigation has led to the present invention.

Thus, the present invention pertains to (1) a process for producing an easily moldable composition of an acetylene high polymer, which comprises polymerizing acetylene using a catalyst system composed of (A) a transition metal compound containing at least one transition metal selected from transition metals of Groups IVa, Va, VIa and VIII of the periodic table (short-period table) and (B) an organometallic compound containing at least one metal selected from metals of Groups IIa, IIb, IIIb and IVb of the periodic table (short-period table), characterized in that the polymerization is carried out in a polymerization solvent containing the transition metal compound in a concentration of 0.0001 to 0.1 mole/liter to form a gel-like material consisting of an acetylene high polymer having a fibrous microcrystalline (fibril) structure and the polymerization solvent.

The present invention also pertains to (2) a process for producing an easily moldable, porous acetylene high polymer, which comprises lyophilizing a gel-like material of an acetylene high polymer having a fibril structure and containing an organic solvent having a freezing point of −50° to 50° C.

This invention also pertains to (3) a process for molding a high polymer of acetylene, which comprises pressing a gel-like material composed of 5 to 95% by weight of an acetylene high polymer having a fibril structure and 95 to 5% by weight of an organic solvent at a temperature of not more than 100° C. and a pressure of at least 1.0 kg/cm$^2$.

As a matter of course, the gel-like material obtained by the process (1) can be used as the gel-like material composed of the acetylene high polymer having a fibril structure and the organic solvent which is used in the processes (2) and (3) of the present invention. Of course, a gel-like material composed of an acetylene high polymer having a fibril structure and an organic solvent obtained by methods other than the process (1) can also be used in processes (2) and (3).

The uniform gel-like material obtained by the process (1) of the present invention is very useful industrially because it can be formed into a molded article having the desired shape and desired film thickness by the press-forming method described in (3) above, and the resulting molded article has sufficiently high mechanical strength. Furthermore, inexpensive catalysts now commercially available can be used as the polymerization catalyst system for production of the uniform gel-like material in process (1) instead of the special catalyst used in the method (c). Hence, the cost of the catalyst is markedly reduced, and the method is very advantageous industrially. Furthermore, the process (1) of the present invention gives a uniform gel-like material and does not form a powdery or a lumpy product. Hence, a molded article obtained by press-forming the resulting gel-like material is uniform and has sufficiently high mechanical strength.

The porous acetylene high polymer having a fibril structure obtained by the process (2) can be produced in desired bulk densities depending upon the polymerization conditions, and has superior moldability. Accordingly, it can be easily molded into an article having the desired shape and desired thickness by a press-forming method, a calendering method, etc. Moreover, since the porous acetylene high polymer has a fibril structure, the resulting molded article also has high mechanical strength and is very useful industrially.

The gel-like material, as referred to in the present invention, denotes an assembly of entangled fibrous microcrystals (fibrils) of a high polymer of acetylene which are swollen with a solvent, and essentially differs from an ordinary crosslinked gel.

DETAILED DESCRIPTION OF THE INVENTION

The transition metal compound containing at least one transition metal of Groups IVa, Va, VIa and VIII of the periodic table which is used as a polymerization catalyst in the present invention specifically includes compounds of titanium, vanadium, chromium, iron, cobalt, tungsten and molybdenum which have a halogen atom or an alkyl group, alkenyl group, aryl group, aralkyl group, alkoxy group, phenoxy group or carboxylic acid residue, each having at most 20 carbon atoms, a cyclopentadienyl group, an acetylacetone residue or carbonyl group, and complexes of these compounds with electron donor compounds such as pyridine, triphenylphosphine and dipyridyl.

Among the transition metal compounds, titanium, vanadium, iron, chromium and cobalt compounds are preferred, and the titanium compounds are especially preferrred.

Transition metal compounds of general formulae (I) to (III) may be cited as typical examples of the preferred transition metal compounds.

Ti(OR)$_4$     (I)

wherein R represents an alkyl or aryl group having at most 20 carbon atoms.

M(acac)$_3$     (II)

MO(acac)$_2$     (III)

[(acac) represents an acetylacetonate group, and M represents a transition metal such as titanium, vandium, chromium or cobalt].

Typical examples of the transition metal compounds include tetramethoxy titanium, tetraethoxy titanium, tetra-n-propoxy titanium, tetraisopropoxy titanium, tetra-n-butoxy titanium, tetraisobutoxy titanium, tetraoctadecyloxy titanium, tetraphenoxy titanium, trisacetylacetonatotitanium, trisacetylacetonatovanadium, trisacetylacetonatoiron, trisacetylacetonatochromium, trisacetylacetonatocobalt, titanium oxyacetylacetonate and vanadium oxyacetylacetonate.

The organometallic compound used in this invention is an organometallic compound having at least one metal selected from Groups IIa, IIb, IIIb and IVb of the periodic table. Some of such compounds are expressed by the following formula MR$_n$ wherein M represents a metal of Groups IIA, IIB, IIIB or IVB of the periodic table, R represents a hydrogen atom, a halogen atom, or an organic group selected from the group consisting of alkyl groups, alkenyl groups, aryl groups, aralkyl groups, alkoxy groups, a phenoxy group and a cyclopentadienyl group having up to 20 carbon atoms, two or more R's may be identical or different but at least one of them is a hydrogen atom or the organic group, and n is a positive integer equal to or smaller than the maximum atomic valence of the metal.

Examples of the other organometallic compounds are complexes of the above organometallic compounds with an equimolar proportion of pyridine, triphenylphosphine or diethylether, the reaction products formed between 1 mole of the above organometallic compounds and at most 2.0 moles of water, and double salts of two of the above organometallic compounds.

Typical examples of the organometallic compounds used in this invention are organometallic compounds having magnesium, calcium, zinc, boron, aluminum, potassium, silicon and tin. The organometallic compounds of magnesium, zinc, aluminum and tin are preferred, and the organoaluminum compounds are especially preferred. Typical examples of the organoaluminum compounds are triethyl aluminum, triisobutyl aluminum, trihexyl aluminum, diethyl aluminum chloride, di-n-butyl aluminum chloride, ethyl aluminum sesquichloride, diethyl aluminum butoxide and the reaction product of triethyl aluminum and water (in a mole ratio of 1:0.5). Other organoaluminum compounds include aluminum-siloxalene compounds, aluminumamide compounds, dialumoxane compounds and double salts containing the aforesaid organoaluminum compounds.

The aluminum-siloxalene compounds used as the organometallic compounds in this invention are expressed by the following general formula

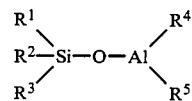

wherein R$^1$, R$^2$ and R$^3$ may be identical or different, and represent a halogen atom or an alkyl or alkoxy group having at most 10 carbon atoms, R$^4$ represents an alkyl group having at most 10 carbon atoms, and R$^5$ represents a halogen atom, an alkyl or alkoxy group having at most 10 carbon atoms, or a substituent of the general formula

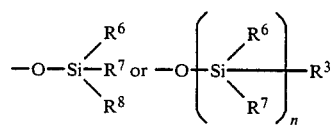

wherein $R^6$, $R^7$ and $R^8$ may be identical or different, and have the same definitions as $R^1$, $R^2$ and $R^3$, and n is a positive integer of not more than 10.

Typical examples of the aluminum-siloxalene compounds used in this invention include trimethlydimethylsiloxalene, trimethyldiethyl-siloxalene, trimethyldi-n-propyl-siloxalene, trimethyl-diisobutyl-siloxalene, trimethyldioctyl-siloxalene, trichlorodimethyl-siloxalene, dimethylethyldiethyl-siloxalene, trimethoxydimethylsiloxalene, triethyldimethyl-siloxalene, trimethyl-dimethoxy-siloxalene, trimethyldimethoxy-siloxalene and trimethoxydichloro-siloxalene.

The aluminum-amide compounds used as the organo-aluminum compound in this invention are expressed by the following general formula

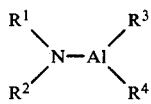

wherein $R^1$, $R^2$ and $R^3$ may be identical or different, and represent a hydrogen atom or an alkyl group having at most 10 carbon atoms, and $R^4$ represents a halogen atom or an alkyl group having at most 10 carbon atoms.

Typical examples of the aluminum-amide compounds used in this invention are diethylaluminum dimethylamide, diethylaluminum diethylamide, dimethylaluminum dimethylamide, dimethylaluminum di-n-butylamide, diethyl aluminum di-n-butylamide, dichloroaluminum dimethylamide, dimethylaluminum dioctylamide, diisobutyl aluminum di-n-butylamide and dihexylaluminum dioctylamide.

The dialumoxane compounds used as the organo-metallic compounds in this invention are expressed by the following general formula

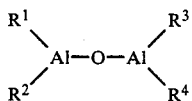

wherein $R^1$, $R^2$ and $R^3$ may be identical or different, and represent a halogen atom or an alkyl or alkoxy group having at most 10 carbon atoms, and $R^4$ represents an alkyl group having at least 10 carbon atoms.

Typical examples of the dialumoxane compounds used in this invention are tetramethyl dialumoxane, tetraethyl dialumoxane, tetraisobutyl dialumoxane, 1,1-dimethyl-3,3-diethyl dialumoxane, tetraisobutyl dialumoxane, 1,1-dimethyl-3,3-diisobutyl dialumoxane, tetradecyl dialumoxane, chlorinated trimethyl dialumoxane and chlorinated triethyl dialumoxane.

Typical examples of the organometallic compounds used in this invention other than the organoaluminum compounds are diethyl magnesium, ethyl magnesium chloride, methyl magnesium iodide, allyl magnesium chloride; n-propyl magnesium chloride, tertiary-butyl magnesium chloride, phenyl magnesium bromide, diphenyl magnesium, ethylethoxymagnesium, dimethyl zinc, diethyl zinc, diethoxy zinc, phenyl iodide calcium, dibutyl chloride boron, diborane, trimethyl boron, triethylsilane, silicon tetrahydride, triethyl silicon hydride, tetramethyl tin, tetraethyl tin, trimethyl tin chloride, dimethyl tin dichloride, hydrogenated trimethyl tin, a complex of brominated ethyl magnesium and ethyl ether, and the reaction product of diethyl zinc and water [$H_2O/Zn(C_2H_5)_2 < 2.0$(mole ratio)].

Double salts of two of the above organometallic compounds (such as lithium aluminum tetrahydride, calcium tetraethyl zinc) may also be cited as the organometallic compound used in this invention.

In practicing the present invention, these organometallic compounds may be used alone or in a combination of two or more.

The ratio of the organometallic compound to the transition metal compound varies depending upon the types and amounts of the transition metal compound and organo-metallic compounds used, the conditions for aging the catalyst system, the polymerization conditions, etc. Generally, the mole ratio of the organometallic compound to the transition metal of the transition metal compound is from 1 to 100, preferably from 1 to 50, especially preferably from 1 to 25.

The yield of the polymer, the rate of polymerization, etc. may be controlled by using a third component in combination with the transition metal compound and the organometallic compound as required. Typical examples of the third component are oxygen-containing compounds such as alcohols, peroxides, carboxylic acids, acid anhydrides, acid chlorides, esters and ketones. Nitrogen-containing compounds, sulfur-containing compounds, halogen-containing compounds, molecular iodine and Lewis acids can also be used.

The polymerization solvent used in this invention may be any organic solvent which is inert to the catalyst system and is liquid during the polymerization. Typical examples are aromatic or aliphatic hydrocarbons, halogenated aromatic or aliphatic hydrocarbons, aromatic or aliphatic ether compounds, alicyclic compounds, and oxygen-containing heterocyclic compounds. Specific examples of these compounds are benzene, toluene, o-, m- or p-xylene, ethylbenzene, methylphenyl ether (anisole), ethylphenyl ether, diphenyl ether, dimethoxybenzene, 1,3,5-trimethoxybenzene, chlorobenzene, dichlorobenzene, pentane, hexane, heptane, octane, nonane, decane, dodecane, cyclohexane, tetrahydrofuran, dioxane, diethyl ether, and ethyl methyl ether.

These polymerization solvents may be used singly or as a mixture of two or more.

In order to obtain a uniform gel-like material of the acetylene high polymer of this invention, polymerization of acetylene should not be performed by using the transition metal compound in a concentration of 0.0001 to 0.1 mole, preferably 0.001 to 0.1 mole, especially preferably 0.01 to 0.1 mole, per liter of the polymerization solution. When the concentration of the transition metal compound exceeds 0.1 mole per liter of the polymerization solution, the resulting gel-like material is difficult to mold. On the other hand, if the concentration of the transition metal compound is less than 0.0001 mole per liter of the polymer solution, a greater part of the acetylene high polymer becomes powdery.

The catalyst solution may be uniform or non-uniform, but from the viewpoint of the ease of catalyst removal, the catalyst solution is preferably uniform.

The polymerization temperature is not particularly restricted. Usually, it is preferably from $-100°$ C. to $300°$ C., and for ease of handling, it is especially preferably from $-80°$ C. to $200°$ C.

The temperature at which the transition metal compound contacts the organometallic compound, and the conditions for aging the catalyst system cannot be definitely determined because they depend upon the types and amounts of the catalyst components used. The contacting temperature is usually from −80° to 100° C. If desired, the catalyst system can be aged before the initiation of polymerization of acetylene, and the aging temperature is usually from −20° to 100° C.

There is no particular restriction on the order of adding the transition metal compound, the organometallic compound and acetylene gas to the polymerization solvent. For example, they may be added in the following orders.

(1) The transition metal compound, the organo-metallic compound, acetylene.
(2) Acetylene, the transition metal compound, the organometallic compound.
(3) The transition metal compound, acetylene, the organometallic compound.

The polymerization may be performed while the polymerization solution is kept stationary, or while it is being mechanically stirred.

In the present invention, the three-dimensional structure of the acetylene high polymer can be controlled by the polymerization temperature, and the conditions for preparation of the catalyst system. Generally, when the polymerization temperature is low, a flexible acetylene high polymer having a high cis content is formed. When the polymerization temperature is higher, an acetylene high polymer having a higher trans content is formed. There is no particular restriction on the pressure of acetylene gas at the time of polymerization, but for practical purposes, it is preferably not more than 10 atmospheres.

The polymerization can be performed by employing a procedure of feeding acetylene gas to the surface of the polymerization solution, or by a procedure of directly introducing acetylene gas into the polymerization solution.

The catalyst may be removed from the resulting gel-like material containing the acetylene high polymer by an ordinary method, for example, by washing the polymerization product with an organic solvent capable of dissolving the catalyst. The product, however, may be used without particularly removing the catalyst.

The resulting uniform gel-like material of acetylene high polymer may be easily press-formed into a uniform molded article having the desired shape and thickness and high mechanical strength.

The resulting acetylene high polymer is of a fibrous microcrystalline (fibril) structure. The acetylene high polymer having a fibrous microcrystalline (fibril) structure as used in this invention denotes a linear crystalline high polymer of acetylene consisting of a random assembly of fibrous microcrystals having a diameter of 200 to 600 Å and comprising a chain of cis or trans conjugated double bonds.

The gel-like material used in this invention, in the process for producing a porous acetylene high polymer having a fibril structure which comprises lyophilizing a gel-like material of acetylene high polymer having a fibril structure containing an organic solvent having a freezing point of −50° to 50° C., may be a gel-like material composed of an acetylene high polymer having a fibril structure and an organic solvent which is prepared by any method. A specific example of the method of preparation may be the process of this invention, but is not limited to this process alone. The cis:trans ratio in the acetylene high polymer may be any desired ratio. It is necessary that the organic solvent in the gel-like material is composed of an organic solvent which has a freezing point near room temperature at least during lyophilization.

The organic solvent, as used herein, is an organic solvent having a freezing point of −50° to 50° C., preferably −30° to 20° C. Organic solvents having a freezing point outside the aforesaid range may be used, but this is industrially disadvantageous because the cost of installation for lyophilization becomes high.

Typical examples of the aforesaid organic solvent include ortho-dichlorobenzene, cyclohexanone, benzyl alcohol, benzonitrile, diethylene glycol, methyl salicylate, formamide, benzene, nitrobenzene, cyclohexane, formic acid, dioxane, meta cresol, para-xylene and acetic acid. The organic solvent is used as a polymerization solvent in the production of acetylene high polymer. Or acetylene is polymerized in an organic solvent other than the aforesaid organic solvents, then a greater part of the organic solvent in the resulting gel-like material of acetylene high polymer is replaced by any one of the aforesaid organic solvents, and then the product is lyophilized. As a result, there can be produced a porous acetylene high polymer in which the shape and dimension inherently possessed by the acetylene high polymer in the gel-like material are substantially retained.

The amount of the organic solvent in the gel-like material is preferably 1 to 1,000 parts by weight per part by weight of the acetylene high polymer. When the amount of the organic solvent is outside this range, it is difficult to obtain a porous acetylene high polymer which is moldable. Lyophilization may be performed by methods usually practised in the art. For example, it may be performed while causing the frozen organic solvent to sublime by a vacuum device. The temperature at the time of lyophilization, which differs depending upon the organic solvent used, is usually in the range of −50° to 50° C.

Since in the present invention, the concentration of the acetylene high polymer in the resulting gel can be freely adjusted by the polymerization conditions, the bulk density of the porous acetylene high polymer can be adjusted to range of 0.1 g/cm$^3$ to 0.0001 g/cm$^3$.

The porous acetylene high polymer obtained by the process of this invention may be used as such or after it is molded into a molded article.

The gel-like material used in the process of this invention for molding a high polymer of acetylene, which comprises pressing a gel-like material composed of 5 to 95% by weight of an acetylene high polymer having a fibril structure and 95 to 5% by weight of an organic solvent at a temperature of not more than 100° C. and a pressure of at least 1.0 kg/cm$^2$, may be a gel-like material composed of an acetylene high polymer having a fibril structure and an organic solvent which may be prepared by any method. A specific example is the process of this invention, but it is not limited to this process alone. The cis-trans ratio of the acetylene high polymer may be any desired ratio.

There is no particular restriction on the organic solvent used in this invention, but typical organic solvents include aliphatic or aromatic hydrocarbons, halogenated hydrocarbons, ethers, carboxylate esters, acid anhydrides, and ketones.

Typical examples are benzene, toluene, xylene, ethylbenzene, methyl phenyl ether (anisole), ethyl phenyl ether, diphenyl ether, n-dimethoxybenzene, p-dimethoxybenzene, n-diethoxybenzene, p-diethoxybenzene, 1,3,5-trimethoxybenzene, pentane, hexane, heptane, octane, nonane, decane, cyclohexane, tetrahydrofuran, dioxane, diethyl ether and ethyl methyl ether.

The organic solvent may be any one of the above organic solvents, or a mixture of at least two of them. After the termination of the polymerization of acetylene, a part of the aforesaid organic solvent may be replaced by a polar solvent such as an aliphatic or aromatic alcohol or a carboxylic acid.

It is permissible to remove a part of the polymerization solvent by an ordinary method, or wash the acetylene polymer with an organic solvent in order to remove the catalyst, after the termination of the polymerization of acetylene. It is essential in this invention that the acetylene polymer be maintained in the gelled state in the presence of organic solvent until it is press-formed. If the acetylene polymer is dried before press-forming to remove all of the organic solvent, its molding becomes impossible.

The proportion of the acetylene high polymer in the gel-like material used in this invention is 5 to 95% by weight. If the proportion of the acetylene high polymer in the gel-like material is less than 5% by weight, it is difficult to produce a molded article having a uniform thickness. If, on the other hand, the proportion of the acetylene high polymer in the gel-like material exceeds 95% by weight, it is difficult to produce a molded article of any desired shape by press-forming.

In the present invention, the temperature of press forming is not more than 100° C., preferably not more than 80° C. If it exceeds 100° C., oxidative degradation of the acetylene high polymer takes place. Accordingly, such temperatures are unsuitable. Press-forming at low temperatures is preferred because oxidative degradation of the acetylene high polymer does not take place. But molding at a temperature of not more than $-50°$ C. is not practical. The molding pressure is at least 1 kg/cm$^2$, preferably 5 kg/cm$^2$. If the pressure is less than 1 kg/cm$^2$, it is impossible to obtain molded articles having sufficiently high mechanical strength. A greater portion of the organic solvent is removed from the acetylene polymer at the time of press forming, but a small amount of the organic solvent may sometimes remain. The remaining organic solvent is sometimes not detrimental to the practical use of the polymer, but may be removed by, for example, vacuum drying.

The above process can easily afford a molded article having high mechanical strength and the desired shape and thickness.

The acetylene high polymer so obtained has a very low electrical resistance, and exhibits electrical properties inherent in so-called semiconductors.

The specific resistance of the molded article at room temperature is about $10^8$ ohms-cm when its cis structure content is high, but decreases with an increasing content of the trans structure. A molded article comprising only a trans structure has a specific resistance of about $10^5$ to $10^4$ ohms-cm., and shows photoconductivity.

The electrical conductivity of the resulting molded particle of acetylene high polymer can be freely controlled over a range of from $10^{-19}$ to $10^3$ ohm$^{-1}$.cm$^{-1}$ by doping it with an electron acceptor compound or an electron donor compound.

Typical examles of the electron acceptor compound are iodine, bromine, bromine iodide, arsenic pentafluoride, antimony pentafluoride, silicon tetrafluoride, phosphorus pentachloride, phosphorus pentafluoride, aluminum chloride, aluminum bromide, peroxydisulfuryl difluoride, sulfuric acid, nitric acid, fluorosulfuric acid, trifluoromethanesulfonic acid, chlorosulfuric acid, boron trichloride, boron tribromide, sulfur trioxide and nitrogen dioxide. Typical examples of the electron donor compounds are sodium, potassium and cesium.

The following Examples illustrate the present invention in greater detail.

EXAMPLE 1

[Method for preparation of a gel-like material]

A 1-liter glass reactor, purged completely with nitrogen gas, was charged successively with 200 ml of toluene purified in a customary manner as a polymerization solvent and 2.94 millimoles of tetrabutoxy titanium and 7.34 millimoles of triethyl aluminum as a catalyst at room temperature, and a catalyst solution was prepared. The catalyst solution was a uniform solution. The reactor was cooled with liquefied nitrogen, and nitrogen gas in the system was removed by a vacuum pump.

The reactor was cooled to $-78°$ C. While the catalyst solution was stirred by a magnetic stirrer, purified acetylene gas under a pressure of 1 atmosphere was blown into the reactor. In the initial stage of the polymerization reaction, the entire system became agar-like, and was difficult to stir. While the pressure of the acetylene gas was maintained at 1 atmosphere, the polymerization reaction was continued for 24 hours. The system was gelatin-like and assumed reddish violet color. After the polymerization, the unreacted acetylene gas was removed, and while maintaining the temperature of the system at $-78°$ C., the reaction mixture was repeatedly washed four times with 200 ml of purified toluene. After the washing, the solution was slighlty brownish, and the catalyst was not completely removed. The gel-like acetylene polymer swollen in toluene was a uniform product in which fibrous microcrystals (fibrils) having a diameter of 200 to 500 Å were entangled irregularly. No powdery or lumpy polymer formed.

[Method for processing the gel-like material]

The gel-like material was held between chromeplated ferro plates, and press-formed at room temperature under a pressure of 100 kg/cm$^2$. There was obtained a uniform flexible film of acetylene high polymer which had a reddish brown metallic luster and high mechanical strength. This film was a P-type semiconductor having an electrical conductivity (direct current four-probe method) of $5.3\times10^{-7}$ ohm$^{-1}$.cm$^{-1}$ at 20° C.

EXAMPLE 2

[Method for preparation of a gel-like material]

A 1-liter glass reactor completely purged with nitrogen gas was charged successively at room temperature with 200 ml of anisole purified in a customary manner as a polymerization solvent and 0.294 millimole of tetrabutoxy titanium and 1.50 millimoles of triisobutyl aluminum as a catalyst, and a catalyst solution was prepared. The catalyst solution was a uniform solution.

The reactor was cooled with liquefied nitrogen, and the nitrogen gas inside was removed by a vacuum pump. Then, the temperature of the reactor was returned to room temperature, and while the catalyst solution was stirred with a magnetic stirrer, purified acetylene gas under a pressure of 1 atmosphere was blown into the reactor. Ten minutes after the initiation of the polymerization, the entire system became a gelatin-like gel material. The stirring was continued, and while maintaining the pressure of acetylene gas at 1 atmosphere for 24 hours the polymerization was continued. The entire system was gelatin-like and assumed a blackish brown color. After the polymerization reaction, the unreacted acetylene gas was removed, and the residue was washed repeatedly four times with 200 ml of a mixture of methanol and toluene (1:1 by volume).

[Method for processing the gel-like material]

The resulting gel-like material was the same uniform gel material as in Example 1. When it was pressformed in the same way as in Example 1, a uniform flexible film was obtained.

EXAMPLE 3

Preparation of a catalyst and polymerization of acetylene were performed in the same way as in Example 1 except that 5.0 millimoles of trisacetylacetonatotitanium and 25.0 millimoles of triethyl aluminum were used instead of the tetrabutoxy titanium and triethyl aluminum used as catalyst components in Example 1. The same uniform gel-like material as in Example 1 was obtained.

EXAMPLE 4

Preparation of a catalyst and polymerization of acetylene were performed in the same way as in Example 1 except that 5.0 millimoles of trisacetylacetonatoiron and 15.0 millimoles of triisobutyl aluminum were used instead of the tetrabutoxytitanium and triethyl aluminum as catalysts components used in Example 1. The same uniform gel-like material as in Example 1 was obtained.

EXAMPLE 5

Preparation of a catalyst and polymerization of acetylene were performed in the same way as in Example 2 except that 0.5 millimole of trisacetylacetonatochromium and 2.5 millimoles of triisobutyl aluminum were used instead of the tetrabutoxy titanium and triisobutyl aluminum as catalyst components used in Example 2. The same uniform gel-like material as in Example 2 was obtained.

COMPARATIVE EXAMPLE 1

A 1-liter glass reactor completely purged with nitrogen gas was charged successively at room temperature with 200 ml of toluene purified in a customary manner as a polymerization solvent and 0.01 millimole of tetrabutoxy titanium and 0.1 millimole of triethyl aluminum as a catalyst, and a catalyst solution was prepared. The catalyst solution was a uniform solution. The reactor was cooled with liquefied nitrogen, and nitrogen gas in the system was removed by a vacuum pump.

The reactor was cooled to $-78°$ C., and while the catalyst solution was being stirred with a magnetic stirrer, purified acetylene gas under a pressure of 1 atmosphere was blown into the catalyst solution. As the polymerization began, a blackish brown powder of acetylene high polymer began to precipitate. While the pressure of the acetylene gas was maintained at 1 atmosphere, the polymerization reactor was performed for 24 hours with stirring at $-78°$ C. The resulting acetylene high polymer was powdery.

The powdery acetylene high polymer was washed repeatedly four times with 200 ml of purified toluene, and then dried in vacuum to afford a powdery acetylene high polymer.

The powdery acetylene high polymer was press-formed under a pressure of 100 kg/cm$^2$ at room temperature between chromium-plated ferro plates. The resulting molded article was very brittle, and could not be obtained as a film.

COMPARATIVE EXAMPLE 2

A 1-liter glass vessel purged completely with nitrogen gas was charged successively with 200 ml of toluene purified in a customary manner as a polymerization solvent, 40 millimoles of tetrabutoxy titanium as a catalyst and 80 millimoles of triethyl aluminum, and a catalyst solution was prepared. The catalyst solution was a uniform solution.

Using the resulting catalyst solution, acetylene was polymerized in the same way as in Example 1. A part of the resulting acetylene high polymer was gel-like, but a greater portion of it was a solid lumpy high polymer which separated as another phase.

The polymer was post-treated in the same way as in Example 1, and then press-formed in the same way as in Example 1. A uniform film could not be obtained.

EXAMPLE 6

Acetylene was polymerized in the same way as in Example 1 with the same catalyst system as used in Example 1 except that acetylene gas was blown while the polymerization system was kept stationary without stirring it. In the initial stage of polymerization, a film of a gel-like polymer formed on the surface of the polymerization solvent, and when the polymerization was performed for 24 hours, the thickness of the film on the surface of the polymerization solvent increased further.

After the polymerization, the catalyst was removed in the same way as in Example 1, and then the film-like gel-like material was press-formed between chrome-plated ferro plates under a pressure of 1 t/cm$^2$ to afford a uniform flexible film of acetylene high polymer which had a metallic luster and high mechanical strength.

EXAMPLE 7

[Method for preparation of a gel-like material]

A 1-liter glass reactor purged completely with nitrogen gas was charged with 200 ml of toluene purified in a customary manner as a polymerization solvent. The reactor was cooled to $-78°$ C., and nitrogen gas in the system was removed by a vacuum pump. Acetylene under a pressure of 1 atmosphere was blown into the solvent to dissolve the acetylene to saturation. Then, as catalysts, 2.94 millimoles of tetrabutoxy titanium and 7.34 millimoles of triethyl aluminum were successively charged into the reactor, and a catalyst solution was prepared. The catalyst solution was a uniform solution.

While the reactor was cooled at $-78°$ C., purified acetylene gas under a pressure of 1 atmosphere was blown into the reactor. In the initial stage of the polymerization reaction, the entire system was gelatin-like. While the pressure of acetylene gas was maintained at 1 atmosphere, the polymerizaion reaction was continued for 24 hours. The system was gelatin-like and assumed a reddish violet color. After the polymerization, the unreacted acetylene gas was removed, and while maintaining the temperature of the system at $-78°$ C., the product was repeatedly washed four times with 200 ml of purified toluene. After the washing, the solution was slightly brownish, and the catalyst was not completely removed. The resulting gel-like acetylene polymer swollen in toluene was a gel-like material in which fibrous microcrystals (fibrils) having a diameter of 300 to 500 Å were entangled irregularly. No powdery or lumpy polymer formed.

[Method for processing the gel-like material]

The gel-like material was held between chrome-plated ferro plates, and press-formed at room temperature under a presssure of 100 kg/cm$^2$ to afford a flexible film of acetylene high polymer which had a reddish brown metallic luster and high mechanical strength.

The film was a P-type semiconductor having an electrical conductivity (direct current four-probe method) of $9.4 \times 10^{-7}$ ohm$^{-7}$.cm$^{-1}$ at 20° C.

EXAMPLE 8

Acetylene was polymerized in the same way as in Example 7 using the same catalyst system as in Example 7 except that n-heptane was used instead of toluene used as the polymerization solvent in Example 7. The same gel-like material as in Example 7 was obtained.

The gel-material was press-formed in the same way as in Example 7 to form a flexible film.

EXAMPLE 9

[Method for producing a gel-like material]

A 1-liter glass reactor completely purged with nitrogen gas was charged with 200 ml of anisole purified in a customary manner as a polymerization solvent and 0.294 millimole of tetrabutoxy titanium as a catalyst component. The reactor was cooled to −78° C., and nitrogen gas in the system was removed by a vacuum pump. Then, acetylene gas under a pressure of 1 atmosphere was blown into the reactor to dissolve acetylene to saturation. Then, 1.50 millimoles of triisobutyl aluminum was charged to prepare a catalyst solution. The catalyst solution was a uniform solution.

The temperature of the reactor was returned to room temperature, and purified acetylene gas under a pressure of 1 atmosphere was blown into the reactor. In 10 minutes after the initiation of the polymerization reaction, the entire system became a gelatin-like gel-like material. The polymerization was continued for 24 hours while maintaining the pressure of acetylene gas at 1 atmosphere. The entire system was gelatin-like and assumed a blackish brown color. After the polymerization reaction, the unreacted acetylene gas was removed, and the residue was washed repeatedly four times with 200 ml of a mixture of methanol and toluene (1:5 by volume).

[Method for processing the gel-like material)]

The resulting gel-like material was the same gel-like material as obtained in Example 7. When it was press-formed in the same way as in Example 7, a uniform film was obtained. The film was a P-type semiconductor having an electrical conductivity of $2.5 \times 10^{-6}$ ohm$^{-1}$.cm$^{-1}$.

EXAMPLE 10

Preparation of a catalyst and polymerization of acetylene were performed in the same way as in Example 7 except that 5.0 millimoles of trisacetylacetonatitanium and 25.0 millimoles of triethyl aluminum were used instead of the tetrabutoxy titanium and triethyl aluminum as catalyst ingredients used in Example 7. The same gel-like material as in Example 7 was obtained.

EXAMPLE 11

Preparation of a catalyst and polymerization of acetylene were performed in the same way as in Example 7 except that 5.0 millimoles of trisacetylacetonatoiron and 15.0 millimoles of triisobutyl aluminum were used instead of the tetrabutoxy titanium and triethyl aluminum used as catalyst ingredients in Example 7. The same gel-like material as in Example 7 was obtained.

EXAMPLE 12

Preparation of a catalyst and polymerization of acetylene were carried out in the same way as in Example 9 except that 0.5 millimole of trisacetylacetonatochromium and 2.5 millimoles of triisobutyl aluminum were used instead of the tetrabutoxy titanium and triisobutyl aluminum used as catalyst ingredients in Example 9. The same gel-like material as in Example 9 was obtained.

COMPARATIVE EXAMPLE 3

A 1-liter glass reactor completely purged with nitrogen gas was charged with 200 ml of toluene purified in a customary manner as a polymerization solvent, and the reactor was cooled to −78° C. Nitrogen gas in the system was removed by a vacuum pump, and acetylene under a pressure of 1 atmosphere was blown into the reactor, to dissolve acetylene to saturation. Then, as catalysts, 0.01 millimole of tetrabutoxy titanium and 0.1 millimole of triethyl aluminum were successively charged into the reactor at −78° C. to prepare a catalyst solution. The reactor was cooled with liquefied nitrogen, and nitrogen gas in the system was removed by a vacuum pump.

While the reactor was cooled at −78° C. purified acetylene gas under a pressure of 1 atmosphere was blown into the reactor. As the polymerization began, an acetylene high polymer began to precipitate as a blackish brown powder. While the pressure of acetylene gas was maintained at 1 atmosphere, the polymerization reaction was performed at −78° C. for 24 hours. The resulting acetylene high polymer was powdery.

The powdery acetylene high polymer was washed repeatedly four times with 200 ml of purified toluene, and vacuum dried to form a powdery acetylene high polymer.

The polymer was held between chrome-plated ferro plates, and press-formed at room temperature under a pressure of 100 kg/cm$^2$. The resulting molded article was very brittle, and was not obtained as a film.

COMPARATIVE EXAMPLE 4

A 1-liter glass vessel purged completely with nitrogen gas was charged with 200 ml of toluene purified in a customary manner as a polymerization solvent. The vessel was cooled to −78° C., and nitrogen gas in the system was removed by a vacuum pump. Then, acetylene gas under a pressure of 1 atmosphere was blown into the vessel to dissolve the acetylene to saturation. Then, as catalysts, 40 millimoles of tetrabutoxy titanium and 80 millimoles of triethyl aluminum were successively charged to prepare a catalyst solution. The catalyst solution was a uniform solution.

Acetylene was polymerized in the same way as in Example 7 using the resulting catalyst solution. A part of the resulting acetylene high polymer was a gel-like material, but a greater portion of it was a solid lumpy high polymer which separated as another phase.

The product was post-treated in the same way as in Example 7, and press-formed in the same way as in Example 7. A uniform film could not be obtained.

EXAMPLE 13

[Method for producing a gel-like material]

A 1-liter glass reactor purged completely with nitrogen gas was charged successively at room temperature with 200 ml of n-heptane purified in a customary manner as a polymerization solvent and 2.94 millimoles of tetrabutoxy titanium and 11.76 millimoles of triethyl aluminum as a catalyst, and a catalyst solution was prepared. The catalyst solution was a uniform solution. The reactor was cooled with liquefied nitrogen, and nitrogen gas in the system was removed by a vacuum pump.

The reactor was cooled to $-78°$ C., and while stirring the catalyst solution with a magnetic stirrer, purified acetylene gas under a pressure of 1 atmosphere was blown into the reactor. In the initial stage of the reaction, the entire system was gelatin-like, and was difficult to stir. While the pressure of the acetylene gas was maintained at 1 atmosphere, the polymerization was performed for 24 hours. The system was gelatin-like and assumed a reddish violet color. After the polymerization, the unreacted acetylene gas was removed, and while maintaining the temperature of the system at $-78°$ C., the residue was washed repeatedly four times with 200 ml of purified n-heptane. After the washing, the solution was slightly brownish, and the catalyst was not completely removed. The gel-like acetylene high polymer swollen in n-heptane was a polymer in which fibrous microcrystals (fibrils) having a diameter of 300 to 500 Å were irregularly entangled.

[Method for processing the gel-like material]

The gel-like material was held between chrome-plated ferro plates, and press-formed at room temperature under a pressure of 100 kg/cm$^2$ to afford a flexible film of acetylene high polymer which had a reddish brown metallic luster.

The film was a P-type semiconductor having an electrical conductivity (direct current four-probe method) of $6.5 \times 10^{-7}$ ohm$^{-1}$.cm$^{-1}$ at 20° C.

EXAMPLE 14

[Method for producing a gel-like material]

A 1-liter glass reactor purged completely with nitrogen gas was charged successively at room temperature with 200 ml of diethyl ether purified in a customary manner as a polymerization solvent and 0.29 millimole of tetrabutoxy titanium and 1.76 millimoles of triisobutyl aluminum as a catalyst, and a catalyst solution was prepared. The catalyst solution was a uniform solution.

The reactor was cooled with liquefied nitrogen, and nitrogen gas in the system was removed by a vacuum pump. Then, the temperature of the reactor was returned to room temperature, and while the catalyst solution was being stirred with a magnetic stirrer, purified acetylene gas under a pressure of 1 atmosphere was blown into the reactor. Ten minutes after the initiation of the polymerization reaction, the entire system became a gelatin-like gel-like material. With continued stirring, the polymerization was continued for 24 hours while maintaining the pressure of the acetylene gas at 1 atmosphere. The entire system was gelatin-like and assumed a blackish brown color. After the polymerization reaction, the unreacted acetylene gas was removed, and the residue was repeatedly washed four times with a 200 ml of a mixture of methanol and diethyl ether (1:2 by volume).

[Method for molding the gel-like material]

The resulting gel-like material was the same gel-like material as obtained in Example 13. When it was press-formed in the same way as in Example 13, a flexible film was obtained.

EXAMPLE 15

Preparation of a catalyst and polymerization of acetylene were performed in the same way as in Example 13 except that 5.0 millimoles of trisacetylacetonatotitanium and 27.0 millimoles of triethyl aluminum were used instead of the tetrabutoxy titanium and triethyl aluminum used as catalyst ingredients in Example 13, and that tetrahydrofuran was used instead of n-heptane. The same gel-like material as in Example 13 was obtained.

EXAMPLE 16

Preparation of a catalyst and polymerization of acetylene were carried out in the same way as in Example 13 except that 5.0 millimoles of trisacetylaecetonatoiron and 25.0 millimoles of triisobutyl aluminum were used instead of the tetrabutoxy titanium and triethyl aluminum used as catalyst ingredients in Example 13. The same gel-like material as in Example 13 was obtained.

EXAMPLE 17

Preparation of a catalyst and polymerization of acetylene were carried out in the same way as in Example 14 except that 0.5 millimole of trisacetylacetonatochromium and 2.5 millimoles of triisobutyl aluminum were used instead of the tetrabutoxytitanium and triisobutyl aluminum as catalyst components used in Example 14. The same gel-like material as in Example 14 was obtained.

COMPARATIVE EXAMPLE 5

A 1-liter glass reactor purged completely with nitrogen gas was charged successively at room temperature with 200 ml of n-heptane purified in a customary manner as a polymerization solvent and 0.01 millimole of tetrabutoxy titanium and 0.1 millimole of triethyl aluminum, and a catalyst solution was prepared. The catalyst solution was a uniform solution. The reactor was cooled with liquefied nitrogen, and the nitrogen gas in the system was removed by a vacuum pump.

The reactor was cooled to $-78°$ C., and while the catalyst solution was being stirred with a magnetic stirrer, purified acetylene gas under a pressure of 1 atmosphere was blown into the reactor. As the polymerization began, a blackish brown acetylene high polymer began to precipitate as a powder. While the pressure of the acetylene gas was maintained at 1 atmosphere, the polymerization was performed with stirring at $-78°$ C. for 24 hours. The resulting acetylene high polymer was a powder.

The powdery acetylene high polymer was repeatedly washed four times with 200 ml of purified n-heptane, and vacuum dried to afford a powdery acetylene high polymer.

The powdery acetylene high polymer was held between chrome-plated ferro plates, and press-formed at room temperature under a pressure of 100 kg/cm$^2$. The resulting molded article was very brittle, and could not be obtained as a film.

COMPARATIVE EXAMPLE 6

A 1-liter glass vessel completely purged with nitrogen gas was charged successively with 200 ml of purified n-heptane in a customary manner as a polymerization solvent and 40 millimoles of tetrabutoxy titanium and 80 millimoles of triethyl aluminum as a catalyst, and a catalyst solution was prepared. The catalyst solution was a uniform solution.

Acetylene was polymerized in the same way as in Example 13 using the resulting catalyst solution. A part of the resulting acetylene high polymer was a gel-like material, but a greater portion of it was a solid lumpy high polymer which separated as another phase.

The polymerization product was post-treated in the same way as in Example 13, and then press-formed in the same way as in Example 13. A uniform film could not be obtained.

EXAMPLE 18

[Method for producing a gel-like material]

A 1-liter glass reactor completely purged with nitrogen gas was charged successively at room temperature with 200 ml of toluene purified in a customary manner as a polymerization solvent and 2.94 millimoles of tetrabutoxy titanium and 7.34 millimoles of triethyl aluminum as a catalyst, and a catalyst solution was prepared. The catalyst solution was a uniform solution. The reactor was cooled with liquefied nitrogen, and nitrogen gas in the system was removed by a vacuum pump.

The reactor was cooled to $-78°$, and while the catalyst solution was stirred with a magnetic stirrer, purified acetylene gas under a pressure of 1 atmosphere was blown into the reactor. In the initial stage of the polymerization reactor, the entire system was gelatin-like, and was difficult to stir.

While the pressure of the acetylene gas was maintained at 1 atmosphere, the polymerization was continued for 24 hours. The system was gelatin-like and assumed a reddish violet color. After the polymerization, the unreacted acetylene gas was removed, and while the temperature of the system was maintained at $-78°$ C., the polymerization product was washed repeatedly four times with 200 ml of purified toluene. After the washing, the solution was slightly brownish, and the catalyst was not completely removed. The gel-like acetylene polymer swollen in toluene was a polymer in which fibrils were irregularly entangled. No powdery or lumpy polymer formed.

[Process for producing a porous product]

The temperature of the system was raised to 10° C., and then the product was washed repeatedly four times with 200 ml of benzene to substitute benzene for a greater portion of the toluene in the system. The resulting gel-like material was dried under vacuum at room temperature. Benzene was solidified by its own heat of evaporation. Vacuum drying was continued to perform lyophilization, thereby giving a porous acetylene high polymer having a bulk density of 0.08 g/cm$^3$ in which the shape and dimension of the gel-like material were retained. Observation of the polymer by a scanning electron microscope showed that it had a fibril structure with a diameter of 200 to 300 Å.

The porous acetylene high polymer was a P-type semiconductor having a cis content of 94% and an electrical conductivity (direct current four-probe method) of $4.7 \times 10^{-9}$ ohm$^{-1}$·cm$^{-1}$.

[Method for processing the porous product]

The porous acetylene high polymer was press-formed at room temperature under a pressure of 100 kg/cm$^2$ to afford a tough film-like acetylene high polymer having a bulk density of 0.80 g/cm$^3$. This film-like acetylene high polymer was a P-type semiconductor having an electrical conductivity of $1.2 \times 10^{-8}$ ohm$^{-1}$·cm$^{-1}$.

[Doping and result]

The film-like acetylene high polymer was put into a reaction vessel, and the air inside was removed. About 2 gr of iodine as an electron acceptor compound was put into it to treat the film-like acetylene high polymer for 2 hours. By treatment with iodine, the weight of the film-like acetylene high polymer increased by 190%, and its electrical conductivity was 108 ohm$^{-1}$·cm$^{-1}$.

COMPARATIVE EXAMPLE 7

The acetylene high polymer gel-like material obtained in Example 18 was slowly dried under vacuum at room temperature without replacing toluene therein by benzene. Thus, a film-like acetylene high polymer having a bulk density of 0.54 g/cm$^3$ was obtained. The resulting film-like acetylene high polymer was tough and was not moldable.

EXAMPLE 19

[Method for producing gel-like material]

A 1-liter glass reactor purged completely with nitrogen gas was charged successively at room temperature with 200 ml of benzene purified in a customary manner as a polymerization catalyst, and 0.294 millimole and of tetrabutoxy titanium and 1.50 millimole of triisobutyl aluminum as a catalyst, and a catalyst solution was prepared. The catalyst solution was a uniform solution. The reactor was cooled with liquefied nitrogen, and nitrogen gas in the system was removed by a vacuum pump.

The temperature of the reactor was returned to room temperature, and while stirring the catalyst solution with a magnetic stirrer, purified acetylene gas under a pressure of 1 atmosphere was blown into the reactor. When the polymerization reaction proceeded for about 10 minutes, the entire system became a gelatin-like gel-like material. With continued stirring, the polymerization was continued for 24 hours while maintaining the pressure of acetylene gas at 1 atmosphere.

The entire system was gelatin-like and assumed a blackish brown color. After the polymerization reaction, the unreacted acetylene gas was removed, and the residue was repeatedly washed four times with 200 ml of benzene.

[Method for producing a porous product]

The resulting gel-like material was lyophilized at room temperature to afford a porous acetylene high polymer in which the shape and dimension of the gel-like material were retained. The porous acetylene high polymer had the same fibril structure as the polymer obtained in Example 18, and was a P-type semiconductor having a bulk density of 0.04 g/cm$^3$, a cis content of 60% and an electrical conductivity of $5.7 \times 10^{-8}$ ohm$^{-1}$·cm$^{-1}$.

[Method for processing the porous product]

The porous acetylene high polymer was press-formed in the same way as in Example 18 to afford a tough molded article having a bulk density of 0.82 g/cm³.

EXAMPLE 20

The gel-like material of acetylene high polymer obtained in Example 18 was lyophilized in the same way as in Example 18 except that toluene in the gel-like material was replaced by 1,4-dioxane instead of benzene. Thus, a porous acetylene high polymer having a bulk density of 0.075 g/cm³ was obtained.

EXAMPLE 21

[Method for producing a gel-like material]

A 1-liter glass reactor purged completely with nitrogen gas was charged successively with at room temperature with 200 ml of toluene purified in a customary manner as a polymerization solvent and 2.94 millimoles of tetrabutoxy titanium and 7.34 millimoles of triethyl aluminum as a catalyst in this order. The catalyst solution was a uniform solution. The reactor was cooled with liquefied nitrogen, and nitrogen gas in the system was removed by a vacuum pump. The reactor was cooled to $-78°$ C., and while stirring the catalyst solution with a magnetic stirrer, purified acetylene gas under a pressure of 1 atmosphere was blown into the reactor. In the initial stage of the polymerization reaction, the entire system became gelatin-like, and was difficult to stir.

The polymerization reaction was continued for 24 hours while the pressure of the acetylene gas was maintained at 1 atmosphere. The system was gelatin-like and assumed a reddish violet color. After the polymerization, the unreacted acetylene gas was removed, and while maintaining the temperature of the system at $-78°$ C., the residue was repeatedly washed four times with 200 ml of purified toluene. After the washing the solution was slightly brownish, and the catalyst was not completely removed. The gel-like acetylene polymer swollen in toluene was a uniform gel-like material in which fibrils having a diameter of 200 to 500 Å were irregularly entangled. No powdery or lumpy polymer formed.

A part of the uniform gel-like material was taken out, and dried, and the amount of the acetylene high polymer in the gel-like material was measured. It was found that the acetylene high polymer was contained in an amount of 10% by weight in the gel-like material.

[Method for press-forming the gel-like material]

The above gel-like material was put into a rectangular mold having an inside thickness of 10 mm, an inside length of 100 mm and an inside width of 50 mm, and held between chrome-plated ferro plates. It was press-formed under a pressure of 100 kg/cm² at room temperature while removing toluene. A flexible tough film-like article having a thickness of 5 mm was obtained. This film-like molded article was a P-type semiconductor having an electrical conductivity (measured by a direct current four-probe method) of $5 \times 10^{-8}$ ohm$^{-1}$.cm$^{-1}$ at 20° C.

[Doping and results]

The film-like molded article was put into a flask, and the air inside was removed by a vacuum pump. Then, iodine gas was introduced at the vapor pressure of iodine at room temperature, and the film-like article was treated with iodine for 1 hour. After treating it for 1 hour, the unreacted iodine was removed by a vacuum pump to obtain an iodine-treated film-like molded article. The iodine-treated film-like molded article was a P-type semiconductor having an electrical condictuvity of 95 ohm$^{-1}$.cm$^{-1}$ at 20° C.

EXAMPLE 22

[Method for press-forming a gel-like material]

The uniform gel-like material obtained by polymerization in Example 21 (containing 10% by weight of acetylene high polymer) was dried in vacuum to afford a gel-like material containing 50% by weight of acetylene high polymer.

The gel-like material was put into a cylindrical mold having a radius of 50 mm, and molded under a pressure of 200 kg/cm² at room temperature while removing toluene. Thus, a tough flexible cylindrical molded article having a thickness of 12 mm was obtained. This molded article was a P-type semiconductor having an electrical conductivity of $4.1 \times 10^{-8}$ ohm$^{-1}$.cm$^{-1}$ at 20° C.

[Doping and results]

The molded article was put into a flask, and after removing the air inside by a vacuum pipe, was treated with a vapor of arsenic pentafluoride. The arsenic pentafluoride-treated molded article was a P-type semiconductor having an electrical conductivity of 550 ohm$^{-1}$.cm$^{-1}$ at 20° C.

EXAMPLE 23

[Method for producing a gel-like material]

A uniform gel-like material was formed by performing preparation of a catalyst and polymerization of acetylene in the same way as in Example 21 except that anisole was used instead of toluene used as the polymerization solvent in Example 21. This gel-like material contained 12% by weight of acetylene high polymer.

[Method for press-forming the gel-like material]

This gel-like material was dried in vacuum to enrich its acetylene polymer content to 70% by weight. The concentrated product was put into a cylindrical mold having an inside radius of 50 mm, and press-formed at room temperature under a pressure of 250 kg/cm² while removing anisole to afford a tough flexible cylindrical article having a thickness of 25 mm. This molded article was a P-type semiconductor having an electrical conductivity of $5.5 \times 10^{-8}$ ohm$^{-1}$.cm$^{-1}$ at 20° C.

[Doping and results]

The molded article was put into a flask, and the air inside was removed by a vacuum pump. Then, it was treated with a vapor of sulfur trioxide. The resulting sulfur trioxide-treated article was a P-type semiconductor having an electrical conductivity of 620 ohm$^{-1}$.cm$^{-1}$ at 20° C.

EXAMPLE 24

[Method for producing a gel-like material]

A uniform gel-like material was formed by performing preparation of a catalyst and polymerization of acetylene in the same way as in Example 21 except that the polymerization of acetylene in Example 21 was carried out at room temperature. The gel-like material contained 18% by weight of acetylene high polymer.

[Method for press-forming the gel-like material]

The gel-like material was dried in vacuum to enrich its acetylene polymer content to 40% by weight. The concentrated product was press-formed in the same way as in Example 23 to afford a cylindrical molded article. This molded article was a P-type semiconductor having an electrical conductivity of $2.7 \times 10^{-4}$ ohm$^{-1}$·cm$^{-1}$ at 20° C.

[Doping and results]

The molded article was treated with iodine by the same method as in Example 21. The resulting iodine-treated molded article was a P-type semiconductor having an electrical conductivity of 16 ohm$^{-1}$·cm$^{-1}$ at 20° C.

CHARACTERISTICS IN INDUSTRIAL UTILIZATION

The gel-like composition composed of an acetylene high polymer having a fibril structure and an organic solvent produced by the process of this invention or the porous acetylene high polymer obtained by lyophilizing the gel-like composition is very useful in industry because it can be easily formed into a molded article having the desired thickness and desired shape and high mechanical strength by the press-forming process of this invention. The resulting molded article of acetylene high polymer has a very low electrical resistance, and shows electrical properties inherent in so-called semiconductors.

The specific resistance of the molded article at room temperature is about $10^8$ ohms-cm when its cis structure content is high, but decreases as the trans structure content increases. A molded article having only the trans structure has a specific resistance of about $10^5$ to $10^4$ ohms-cm. Furthermore the molded article show photoconductivity. By utilizing the aforesaid electrical properties, the acetylene high polymer can be used as an organic semiconductor material for the production of electrical appliance parts such as electrical resistance elements, thermosensitive elements and photosensitive elements.

By doping the resulting molded article of acetylene high polymer with an electron acceptor compound or an electron donor compound, its electrical conductivity can be freely controlled over a wide range of from $10^{-9}$ to $10^3$ ohm$^{-1}$·cm$^{-1}$. The resulting electrically conductive acetylene high polymer is a P-type or N-type semiconductor whose electrical conductivity can be freely controlled over a range of $10^{-9}$ to $10^3$ ohm$^{-1}$·cm$^{-1}$ by the type and amount of the electron acceptor compound. The conductive acetylene high polymer can directly be used as a conductive material useful as flexible electrical and electronics elements, and also can be easily formed into a P-M heterojunction element in combination with an N-type or P-type semiconductor. The acetylene high polymer has a band gap energy of 1.6 eV to 1.9 eV, and shows photoconduction under visible light. Because of this, it is also useful as a material for various photoelectrical converter elements such as solar cells and photosensors.

What is claimed is:

1. A process for producing an electrically conductive molded article of an acetylene high polymer, which comprises press-forming a gel-like composition composed of 5 to 95% by weight of an acetylene high homopolymer having a fibril structure and 95 to 5% by weight of an organic solvent, said gel-like composition being a product prepared by polymerizing acetylene in a polymerization solvent containing a catalyst system composed of (A) a transition metal compound containing at least one transition metal selected from transition metals of Groups IVa, Va, VIa and VIII of the periodic table and (B) an organometallic compound containing at least one metal selected from metals of Groups IIa, IIb, IIIb and IVb of the periodic table, the concentration of the transition metal compound being 0.0001 to 0.1 mole per liter of the polymerization solvent, and treating the resultant press-formed article with an electron acceptor or donor substance.

2. The process set forth in claim 1 wherein the transition metal compound is selected from the group consisting of a compound of the formula Ti(OR)$_4$, a compound of the formula M(acac)$_3$, and a compound of the formula MO(acac)$_2$, wherein R is alkyl or aryl of at most 20 carbon atoms, M is a transition metal, and acac is acetylacetonate.

3. The process set forth in claim 1 wherein the press-forming is carried out at a temperature of not more than 100° C.

4. The process set forth in claim 1 wherein the press-forming is carried out at a pressure of at least 1.0 kg/cm$^2$.

5. The process set forth in claim 1 wherein the organic solvent is an aliphatic or aromatic compound selected from hydrocarbons, halogenated hydrocarbons, ethers, carboxylate esters, acid anhydrides and ketones.

* * * * *